US008373415B2

(12) United States Patent
Reeder et al.

(10) Patent No.: US 8,373,415 B2
(45) Date of Patent: Feb. 12, 2013

(54) METHOD FOR SEPARATING MAGNETIC RESONANCE IMAGING SIGNALS USING SPECTRAL DISTINCTION OF SPECIES

(75) Inventors: Scott B Reeder, Middleton, WI (US); Huanzhou Yu, Sunnyvale, CA (US)

(73) Assignees: Wisconsin Alumni Research Foundation, Madison, MI (US); General Electric Company, Brookfield, WI (US)

( * ) Notice: Subject to any disclaimer, the term of this patent is extended or adjusted under 35 U.S.C. 154(b) by 483 days.

(21) Appl. No.: 12/761,231

(22) Filed: Apr. 15, 2010

(65) Prior Publication Data

US 2011/0254547 A1 Oct. 20, 2011

(51) Int. Cl.
*G01V 3/00* (2006.01)
(52) U.S. Cl. ........................................ 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 4,896,113 | A * | 1/1990 | Pelc | 324/309 |
| 6,577,128 | B1 * | 6/2003 | Smith et al. | 324/309 |
| 6,856,134 | B1 | 2/2005 | Reeder et al. | |
| 7,109,705 | B2 * | 9/2006 | Smith et al. | 324/300 |
| 7,176,683 | B2 | 2/2007 | Reeder et al. | |
| 7,202,665 | B1 | 4/2007 | Reeder | |
| 7,349,729 | B2 | 3/2008 | Reeder et al. | |
| 7,486,074 | B2 | 2/2009 | McKenzie et al. | |
| 7,508,211 | B2 | 3/2009 | Wen et al. | |
| 7,576,535 | B2 * | 8/2009 | Hargreaves | 324/307 |
| 7,592,807 | B2 | 9/2009 | Pineda et al. | |
| 7,592,810 | B2 | 9/2009 | Reeder et al. | |
| 7,741,842 | B2 | 6/2010 | McKenzie et al. | |
| 7,924,003 | B2 | 4/2011 | Yu et al. | |
| 8,135,452 | B2 * | 3/2012 | Dougherty et al. | 600/420 |
| 2009/0257634 | A1 | 10/2009 | Moeller et al. | |
| 2009/0276187 | A1 | 11/2009 | Martin et al. | |
| 2011/0044524 | A1 * | 2/2011 | Wang et al. | 382/131 |
| 2011/0254548 | A1 * | 10/2011 | Setsompop et al. | 324/309 |

OTHER PUBLICATIONS

Bydder, M., et al., Fat-Fat Interations in Dixon-Variant Imaging, Proc. Intl. Soc. Mag. Reson. Med., 2007, 15:1632.
Bydder, M., et al., Relaxation Effects in the Quantification of Fat Using Gradient Echo Imaging, Magn. Reson. Imaging, 2008, 26(3):347-359.
Hernando, D., et al., Estimation of Water/Fat Images, B0 Field Map and T2* Map Using VARPRO, Proc. Intl. Soc. Mag. Reson. Med., 2008, 16:1517.
Hernando, D., et al., Joint Estimation of Water/Fat Images and Field Inhomogeneity Map, Mag. Reson. Med., 2008, 59:571-580.
Hernando, D., et al., Robust Water/Fat Separation in the Presence of Large Field Inhomogeneities Using a Graph Cut Algorithm, Mag. Reson. Med., 2010, 63:79-90.
Jacob, M., et al., Algebraic Decomposition of Fat and Water in MRI, IEEE Transactions on Medical Imaging, 2009, 28 (2):173-184.

(Continued)

*Primary Examiner* — Brij Shrivastav
(74) *Attorney, Agent, or Firm* — Quarles & Brady, LLP

(57) ABSTRACT

A method for producing an image of a subject with a magnetic resonance imaging (MRI) system in which a signal contribution of a chemical species is depicted and a signal contribution of another chemical species is substantially separated is provided. For example, the provided method is applicable for water-fat separation. Spectral differences between at least two different chemical species are exploited to produce a weighting map that depicts the likelihood that one chemical species being depicted as another. A weighting map that characterizes the smoothness of a field map variation is also produced. These weighting maps are utilized to produce a correct field map estimate, such that a robust separation of the signal contributions of the at least two chemical species can be performed.

26 Claims, 6 Drawing Sheets

OTHER PUBLICATIONS

Lu, W., et al., Multiresolution Field Map Estimation Using Golden Section Search for Water-Fat Separation, Mag. Reson. Med., 2008, 60:236-244.

MA, J., Breath-Hold Water and Fat Imaging Using a Dual-Echo Two-Point Dixon Technique With an Efficient and Robust Phase-Correction Algorithm, Mag. Reson. Med., 2004, 52:415-419.

Schmidt, M., et al., Two-Point Dixon Fat-Water Separation: Improving Reliability and Accuracy in Phase Correction Algorithms, J. Mag. Reson. Imaging, 2008, 27:1122-1129.

Xiang, Q., Two-Point Water-Fat Imaging With Partially-Opposed-Phase (POP) Acquisition: An Asymmetric Dixon Method, Mag. Reson. Med., 2006, 56:572-584.

Xiang, Q., et al., Water-Fat Imaging with Direct Phase Encoding, JMRI, 1997, 7:1002-1015.

Yu, H., et al., Field Map Estimation with a Region Growing Scheme for Iterative 3-Point Water-Fat Decomposition, Mag. Reson. Med., 2005, 54:1032-1039.

Yu, H., et al., Multiecho Reconstruction for Simultaneous Water-Fat Decomposition and T2* Estimation, J. Mag. Reson. Imaging, 2007, 26:1153-1161.

Yu, H., et al., Multiecho Water-Fat Separation and Simultaneous R*2 Estimation With Multifrequency Fat Spectrum Modeling, Mag. Reson, Med., 2008, 60:1122-1134.

* cited by examiner

METHOD FOR SEPARATING MAGNETIC RESONANCE IMAGING SIGNALS USING SPECTRAL DISTINCTION OF SPECIES

BACKGROUND OF THE INVENTION

The field of the invention is magnetic resonance imaging ("MRI") systems and methods. More particularly, the invention relates to systems and methods for separating the signal contributions from two or more different species from signals acquired with and MRI system from a subject.

Magnetic resonance imaging ("MRI") uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set.

Conventional fat suppression or water-fat decomposition methods model fat as a single resonance frequency at approximately 3.5 ppm (210 Hz at a field strength of 1.5 Tesla, and 420 Hz at a magnetic field strength of 3.0 Tesla) away from the water resonance frequency. Exemplary methods of conventional fat suppression include spectral saturation ("FatSat"), and chemical-shift based multi-point Dixon methods. Multi-point water-fat separation methods have seen increasing use in routine clinical applications, following recent developments that make them more reliable, faster, and flexible. In general, these methods acquire signal from multiple echoes with different water-fat phase shifts, so that water and fat can be separated with the correction of $B_0$ field inhomogeneities. Commonly, two or three echoes are acquired, which is sufficient for qualitative water-fat separation. When more echoes are collected, however, newer algorithms can simultaneously estimate a $T_2^*$ decay map, thereby producing water and fat images that are corrected for $T_2^*$ decay effects.

Recently, a new method known as iterative decomposition of water and fat with echo asymmetry and least squares estimation ("IDEAL") was developed for imaging spin species such as fat and water. As described in U.S. Pat. No. 6,856,134, the IDEAL method employs pulse sequences to acquire multiple images at different echo times ("TE") and an iterative, linear least squares approach to estimate the separate water and fat signal components. However, this method also models the fat signal as having one resonance frequency, as do all other multi-point Dixon methods.

The multi-point water-fat separation methods, from the early Dixon methods to more recently IDEAL algorithms, all must address the intrinsic challenge of water-fat ambiguity. This ambiguity problem arises due to the fact that the signal behavior of two chemical species with a single NMR spectrum, but at different chemical shifts, may appear identical in the presence of $B_0$ inhomogeneities. In this situation, the signal from a voxel containing substantially only one species can be identical for two possible scenarios. First, where the voxel contains a first species, such as water, with a given $B_0$ off-resonance value, and second, where the voxel contains a second species, such as fat, with a different $B_0$ off-resonance value. For example, with water and fat, a voxel containing only fat "looks" just like a voxel containing only water that is off-resonance by 210 hertz ("Hz") at a $B_0$ field strength of 1.5 Tesla ("T"). This ambiguity is the fundamental challenge of chemical shift based chemical species separation, and for water and fat is, therefore, commonly referred to as the "water-fat ambiguity." Such ambiguities often result in water-fat swaps, in which a voxel containing, for example, water is mischaracterized as containing fat.

The challenge of water-fat ambiguity is commonly addressed by assuming a slowly and smoothly varying $B_0$ field inhomogeneity map, or "field map," without abrupt discontinuities, or "jumps," in the field map that would occur when there is a water-fat swap. Previous multi-echo water-fat separation methods attempt to resolve the water-fat ambiguity by enforcing field map smoothness. However, these algorithms are typically based on variations of region growing algorithms, and are similar in principle to two-dimensional phase unwrapping methods, which are well known to be error prone and sensitive to noise and the physical characteristics of the object. Despite a number of sophisticated algorithms that have been developed by various groups, accurate field map estimation for extremely robust water-fat separation is very challenging.

In particular, when pulse sequences that acquire signals from multiple echoes per each repetition time ("TR") period are used, the minimum echo time TE increment for a given desired resolution is increased, effectively reducing the spectral field-of-view ("FOV") in which the field map can be uniquely determined. As a result, it is more challenging to design a robust field map algorithm for acquisitions with larger phase shifts, which occur with longer echo time increments, such as is needed with high resolution imaging, or at higher $B_0$ field strengths, such as 3 T and above. These limitations lead to compromises in available imaging choices.

SUMMARY OF THE INVENTION

The present invention overcomes the aforementioned drawbacks by providing a method for separating the nuclear magnetic resonance ("NMR") signal contributions from at least two different species that accounts for off-resonance errors resulting from magnetic field variations and their potentially inaccurate estimations.

It is an aspect of the invention to provide a method for the separation of water and fat signal acquired with a magnetic resonance imaging ("MRI") system. Differences in the spectral characteristics of water and fat are utilized to produce a map that depicts the likelihood that a given pixel location corresponds to water or fat. For example, water has a single NMR resonance peak, while fat has multiple discrete peaks at different resonance frequencies. An additional weighting map can be produced to assess the consistency of this likelihood map with an estimate of the relative signal contribution for a given pixel location. These "spectral difference" weighting maps are utilized to update and correct a field map estimate, which depicts the spatial variation of the main magnetic field of the MRI system. Using the updated field map estimate, a more robust separation of the water and fat signals is performed, in which so-called "swap solutions" that indicate the incorrect identification of a pixel location as belonging to either water when it should be fat, or vice versus, are substantially mitigated.

It is another aspect of the invention to provide a method for producing another weighting map that characterizes the spatial variation of a field map estimate. Such a "smoothness" map indicates the likelihood of water-fat swap for a given field map location. By way of example, this method is presented with respect to a so-called IDEAL and $T_2^*$-IDEAL water-fat separation method framework.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

As will be described below in detail, the multi-peak nature of the fat resonance spectrum can be utilized to produce a more robust estimation of inhomogeneities in the main magnetic field of a magnetic resonance imaging ("MRI") system. In turn, image pixels in which water or fat signals have been "swapped" for the other can be more reliably identified. While the succeeding description describes a method for reliably separating water and fat signals, it will be appreciated by those skilled in the art that the method can be readily adapted to perform the separation of two or more distinct species in which the species have resonance spectra sufficiently unique to be distinctly identifiable from the other species. As used herein, the term "species" refers to any of a particular kind of atomic nucleus, atom, molecule, or ion. By way of example, the method of the present invention can be readily adapted to provide accurate separation of hyperpolarized carbon-13, metabolites containing hyperpolarized carbon-13, hyperpolarized xenon-129, hyperpolarized helium-3, acetone, choline, lactate, and silicone proton NMR signals. For example, the signal from protons in water, fat, and silicone can all be separated accurately in the same imaging application by way of the method of the present invention.

Figure 1:
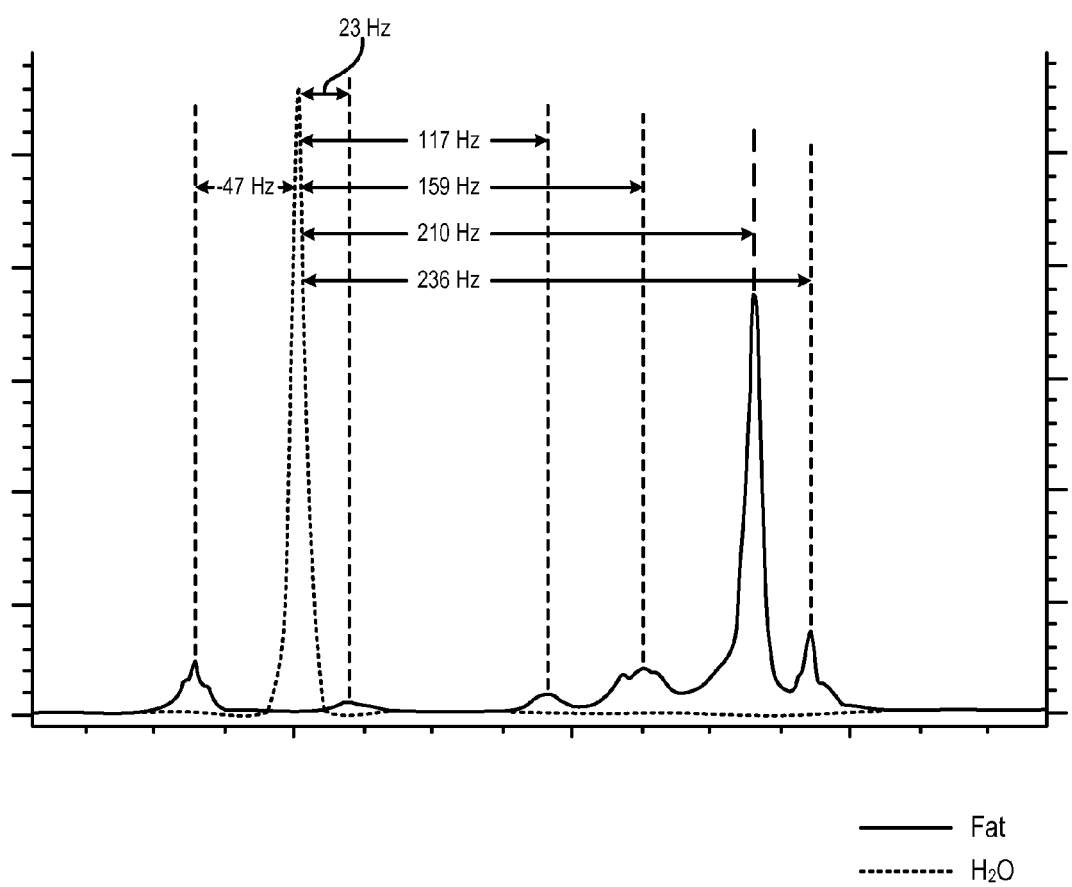
FIG. 1 is an exemplary resonance frequency spectrum for fat at a magnetic field strength of 1.5 Tesla.

Fat has a complex spectral profile that includes multiple resonance frequencies. To exemplify this point, reference is made to FIG. 1, where a more accurate model of a fat resonance frequency spectrum is shown that includes six resonance frequencies. At a magnetic field strength of 1.5 Tesla, the fat spectrum has, relative to the water resonance frequency, peaks at: 47 Hz, −23 Hz, −117 Hz, −159 Hz, −210 Hz, and −236 Hz at body temperature. Commonly, it is only the −210 Hz fat peak that is targeted in fat suppression methods and modeled in water-fat decomposition, or separation, methods; however, this leads to undesired effects, especially when performing quantitative studies.

Figure 2:
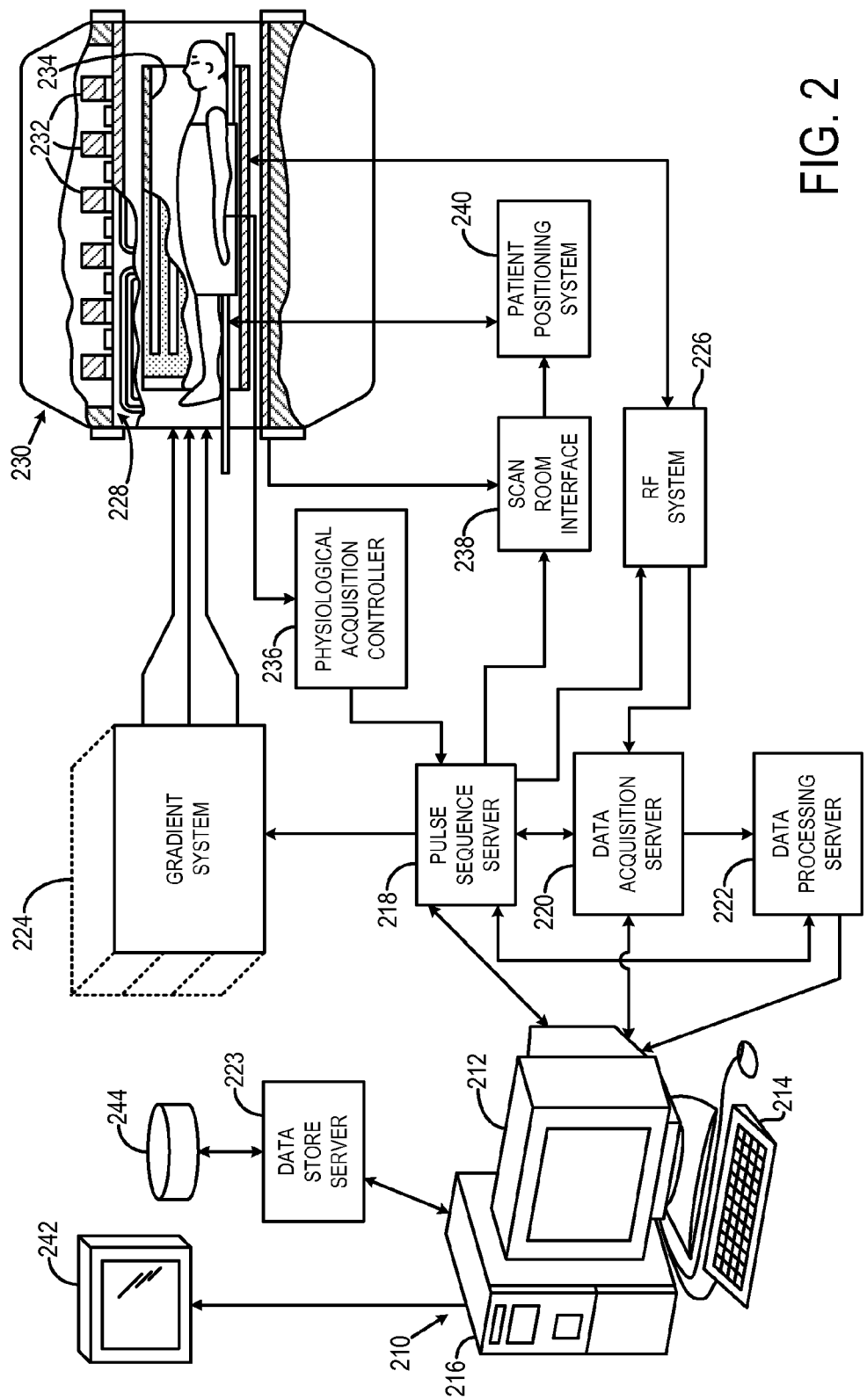
FIG. 2 is a block diagram of an exemplary magnetic resonance imaging ("MRI") system that employs the present invention.

Referring particularly to FIG. 2, the preferred embodiment of the invention is employed in a magnetic resonance imaging ("MRI") system. The MRI system includes a workstation 210 having a display 212 and a keyboard 214. The workstation 210 includes a processor 216 that is a commercially available programmable machine running a commercially available operating system. The workstation 210 provides the operator interface that enables scan prescriptions to be entered into the MRI system. The workstation 210 is coupled to four servers: a pulse sequence server 218; a data acquisition server 220; a data processing server 222, and a data store server 223. The workstation 210 and each server 218, 220, 222 and 223 are connected to communicate with each other.

The pulse sequence server 218 functions in response to instructions downloaded from the workstation 210 to operate a gradient system 224 and a radiofrequency ("RF") system 226. Gradient waveforms necessary to perform the prescribed scan are produced and applied to the gradient system 224 that excites gradient coils in an assembly 228 to produce the magnetic field gradients $G_x$, $G_y$, and $G_z$ used for position encoding MR signals. The gradient coil assembly 228 forms part of a magnet assembly 230 that includes a polarizing magnet 232 and a whole-body RF coil 234.

RF excitation waveforms are applied to the RF coil 234 by the RF system 226 to perform the prescribed magnetic resonance pulse sequence. Responsive MR signals detected by the RF coil 234 or a separate local coil (not shown in FIG. 2) are received by the RF system 226, amplified, demodulated, filtered and digitized under direction of commands produced by the pulse sequence server 218. The RF system 226 includes an RF transmitter for producing a wide variety of RF pulses used in MR pulse sequences. The RF transmitter is responsive to the scan prescription and direction from the pulse sequence server 218 to produce RF pulses of the desired frequency, phase and pulse amplitude waveform. The generated RF pulses may be applied to the whole body RF coil 234 or to one or more local coils or coil arrays (not shown in FIG. 2).

The RF system 226 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 218 also optionally receives patient data from a physiological acquisition controller 236. The controller 236 receives signals from a number of different sensors connected to the patient, such as ECG signals from electrodes or respiratory signals from a bellows. Such signals are typically used by the pulse sequence server 218 to synchronize, or "gate," the performance of the scan with the subject's respiration or heart beat.

The pulse sequence server 218 also connects to a scan room interface circuit 238 that receives signals from various sensors associated with the condition of the patient and the magnet system. It is also through the scan room interface circuit 238 that a patient positioning system 240 receives commands to move the patient to desired positions during the scan.

The digitized MR signal samples produced by the RF system 226 are received by the data acquisition server 220. The data acquisition server 220 operates in response to instructions downloaded from the workstation 210 to receive the real-time MR data and provide buffer storage such that no data is lost by data overrun. In some scans the data acquisition server 220 does little more than pass the acquired MR data to the data processor server 222. However, in scans that require information derived from acquired MR data to control the further performance of the scan, the data acquisition server 220 is programmed to produce such information and convey it to the pulse sequence server 218. For example, during prescans MR data is acquired and used to calibrate the pulse sequence performed by the pulse sequence server 218. Also, navigator signals may be acquired during a scan and used to adjust RF or gradient system operating parameters or to control the view order in which k-space is sampled. And, the data acquisition server 220 may be employed to process MR signals used to detect the arrival of contrast agent in a magnetic resonance angiography ("MRA") scan. In all these examples the data acquisition server 220 acquires MR data and processes it in real-time to produce information that is used to control the scan.

The data processing server 222 receives MR data from the data acquisition server 220 and processes it in accordance with instructions downloaded from the workstation 210. Such processing may include, for example: Fourier transformation of raw k-space MR data to produce two or three-dimensional images; the application of filters to a reconstructed image; the performance of a backprojection image reconstruction of acquired MR data; the calculation of functional MR images; and the calculation of motion or flow images.

Images reconstructed by the data processing server 222 are conveyed back to the workstation 210 where they are stored. Real-time images are stored in a data base memory cache (not shown) from which they may be output to operator display 212 or a display 242 that is located near the magnet assembly 230 for use by attending physicians. Batch mode images or selected real time images are stored in a host database on disc storage 244. When such images have been reconstructed and transferred to storage, the data processing server 222 notifies the data store server 223 on the workstation 210. The workstation 210 may be used by an operator to archive the images, produce films, or send the images via a network to other facilities.

Figure 3:
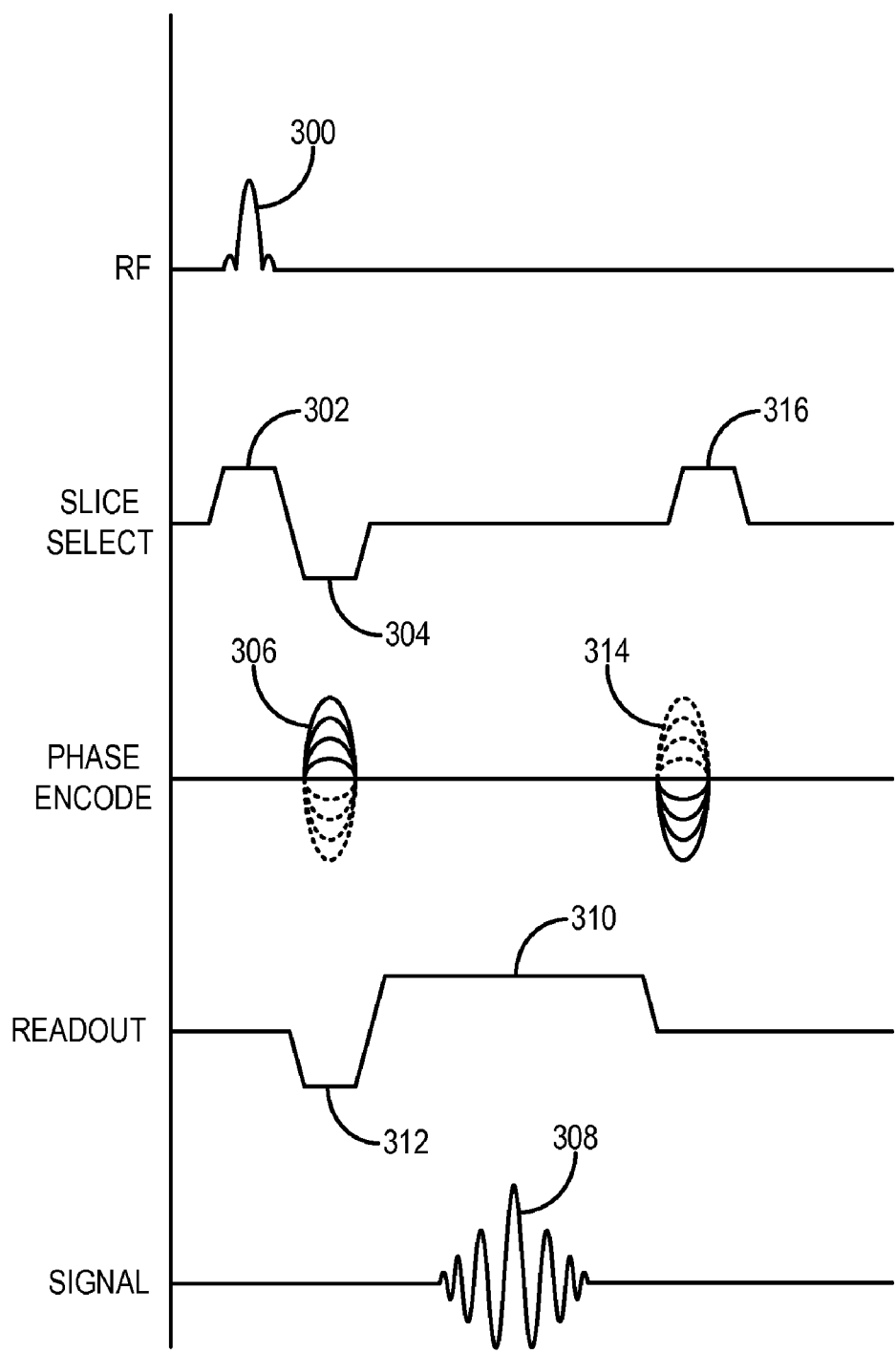
FIG. 3 is a graphic representation of an exemplary spoiled gradient recalled echo ("SPGR") pulse sequence for directing the MRI system of FIG. 2 to acquire image data in accordance with the present invention.

An exemplary pulse sequence employed to direct the MRI system to acquire image data in accordance with the present invention is illustrated in FIG. 3. Such an exemplary pulse sequence is commonly referred to as a spoiled gradient recalled echo ("SPGR") pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo planar imaging ("EPI") sequences, spiral imaging sequences, and radial imaging sequences. Moreover, acquisitions with relatively long echo spacing, or echo time increment, can be employed, even though such echo spacing is traditionally challenging for robust field map estimation. For example, at high magnetic field strengths the increased chemical shift leads to increased phase shifts between water and fat unless the echo spacing is decreased. The method of the present invention, however, can produce an accurate water-fat separation, even in light of these pulse sequence choices.

The exemplary SPGR pulse sequence includes a spatially selective radio frequency ("RF") excitation pulse 300 that is repeated at the start of each repetition time ("TR") period. Moreover, the RF excitation pulse 300 is played out in the presence of a slice-selective gradient 302 in order to produce transverse magnetization in a prescribed imaging slice. The slice selective gradient 302 includes a rephasing lobe 304 that acts to rephase unwanted phase accruals caused by the RF excitation pulse 300. Following excitation of the nuclear spins in the prescribed imaging slice, a phase encoding gradient 306 is applied to spatially encode a nuclear magnetic resonance signal, representative of a gradient-recalled echo 308, along one direction in the prescribed imaging slice. A readout gradient 310 is also applied after a dephasing gradient lobe 312 to spatially encode the signal representative of echo 308 along a second, orthogonal direction in the prescribed imaging slice. The signal representative of echo 308 is sampled during a data acquisition window.

A rewinder gradient 314 is played out along the phase-select gradient axis in order to rephase remaining transverse magnetization in preparation for subsequent repetitions of the pulse sequence. As is well known in the art, the pulse sequence is repeated and the amplitude of the phase encoding gradient 304 and the rewinder 314, which is equal in amplitude and area, but opposite in polarity with respect to the phase encoding gradient 304, are stepped through a set of values such that k-space is sampled in a prescribed manner. The pulse sequence concludes with the application of a spoiler gradient 316 that spoils the remaining transverse magnetization.

As will be explained in more detail below, image data is acquired a plurality of times from each prescribed imaging slice, and the echo time ("TE") is incremented during successive repetitions such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. By way of example, the successive echo times are incremented by 1.6 ms during each successive repetition of the pulse sequence. It is noted that any number of multiple echoes can be acquired when practicing the present invention, including only two echoes, in which so-called "2-point Dixon methods" can be employed. In general the more echoes that are acquired, the more reliable the method will be. For example, as the number of echoes acquired is increased, the spectral differences between species becomes more "observable." Additional echoes may be acquired with low spatial resolution in order to minimize additional scan time requirements.

The pulse sequence employed to direct the MRI system to acquire data can be adapted to include magnetization preparation pulses in order to manipulate the spectra of the species being images. For example, non-selective or spectrally selective magnetization preparation pulses can be utilized, such as inversion recovery pulses, $T_2$-prep pulses, fat-sat pulses, and magnetization transfer pulses. SSFP pulse sequences can also be implemented to alter the characteristics of specific spectral peaks. In this manner, a particular spectrum can be made more "unique" and easier to separate. For example, if different peaks of fat are placed in different spectral pass bands of an SSFP-based acquisition, the change in phase between pass bands will alter the sign, positive or negative, of specific spectral peaks. This behavior can be exploited to improve the robustness of the separation. Other preparation methods include $T_2$-prep methods; magnetization transfer methods; methods that facilitate J-coupling; methods that exploit differences in $T_1$ or $T_2$ between species, or between peaks within a specific species; velocity encoding; and any such methods that change the appearance of the spectrum of a particular species.

For most methods utilizing traditional IDEAL-based techniques, and other water-fat separation algorithms, an estimate of inhomogeneities in the main magnetic field of the MRI system, $B_0$, is produced and utilized to separate the relative signal contributions from water and fat. This estimate is referred to as a "field map" estimate. This field map estimation may, however, converge to local minima that lead to water-fat "swaps." In certain circumstances, including when symmetric echoes are used, or for pixels containing only one species, these local minima are exact solutions. The field map solutions that lead to water-fat swaps are referred to herein as "swapped solutions." The method of the present invention is applicable to identify those pixels with swapped solutions in the estimated field map, thereby providing a method for the separation of signals from at least two distinct species that is more robust than currently available methods. As noted above, the method of the present invention is applicable to a number of different signal separation methods. The succeeding description is made with reference to an IDEAL-based technique for water-fat separation; however, it should be appreciated by those skilled in the art that the method is readily adaptable to other signal separation methods.

In traditional IDEAL-based techniques, and other related techniques, the field map is often estimated iteratively from signal data acquired from a plurality of echo times. This iterative problem is not convex, however. As a result, the iterations may converge to local minima and lead to water-fat swaps. The "goodness" of the field map estimate can be characterized using the "residual," R, of a field map value, which is given by the following equation:

$$R = \|((D(\psi) \cdot A(A^* \cdot A)^{-1} \cdot A^* \cdot D(-\psi)) - I) \cdot s\| \qquad \text{Eqn. (3)};$$

where s is a signal vector that represents the acquired NMR signals, as represented by images reconstructed from the image data acquired with the MRI system; $\psi$ is the estimated field map for the selected pixel; A is a matrix that describes the relative weighting of the different spectral peaks and complex phase shifts of the signals at the different echo times; I is an identity matrix; and $D(\psi)$ is a diagonal matrix having the following form:

$$D(\psi) = \begin{bmatrix} e^{i2\pi\psi t_1} & 0 & \cdots & 0 \\ 0 & e^{i2\pi\psi t_2} & \cdots & 0 \\ \vdots & \vdots & \ddots & \vdots \\ 0 & 0 & \cdots & e^{i2\pi\psi t_N} \end{bmatrix}; \qquad \text{Eqn. (4)}$$

where $t_N$ is the $N^{th}$ echo time. For a multi-peak model, the matrix, A, in Eqn. (3) has the following form:

$$A = \begin{bmatrix} 1 & \sum_{k=1}^{M} \alpha_k e^{i2\pi\Delta f_k t_1} \\ 1 & \sum_{k=1}^{M} \alpha_k e^{i2\pi\Delta f_k t_2} \\ \vdots & \vdots \\ 1 & \sum_{k=1}^{M} \alpha_k e^{i2\pi\Delta f_k t_N} \end{bmatrix}; \qquad \text{Eqn. (5)}$$

where the weighted sum of exponentials $$\sum_{k=1}^{M} \alpha_k e^{i2\pi\Delta f_k t_N}$$

describes the signal contributions from the $k^{th}$ fat spectral peak, having resonance frequency $\Delta f_k$ and relative amplitude $\alpha_k$, for the image data acquired at the $N^{th}$ echo time, $t_N$. Further, for a single-peak model, the matrix, A, has the form:

$$A = \begin{bmatrix} 1 & e^{i2\pi\Delta ft_1} \\ 1 & e^{i2\pi\Delta ft_2} \\ \vdots & \vdots \\ 1 & e^{i2\pi\Delta ft_N} \end{bmatrix}. \qquad \text{Eqn. (6)}$$

It is noted that the coefficients in both the multi-peak and single-peak matrices are known values.

As can be seen from Eqn. (3), for a pixel with a given set of collected signals, the residual, R, is a function of both the field map value and the model used, such as single-peak or multi-peak. A small residual, R, suggests that the acquired signals and the field map value fits the model well; however, if the spectral shape of the two species is substantially identical, the swapped solutions may appear to be proper solutions yielding a significantly low residual, R. Thus, in general, for the single-peak model, the absolute values of residual cannot be relied upon to distinguish a true solution and a "swapped solution."

In $T_2^*$-IDEAL techniques, water-fat separation is performed substantially contemporaneously with $T_2^*$ estimation and correction. The $T_2^*$-IDEAL technique is described, for example, in U.S. Pat. No. 7,468,605, which is herein incorporated by reference in its entirety. In multi-peak IDEAL and $T_2^*$-IDEAL techniques, the fat spectrum is modeled to have multiple spectral peaks, whereas water is modeled to have a single peak. The multi-peak $T_2^*$-IDEAL/IDEAL methods are described, for example, in U.S. Pat. No. 7,202,665, which is herein incorporated by reference in its entirety. Therefore, the same spectral differences between water and fat that are exploited in multi-peak $T_2^*$-IDEAL/IDEAL are usable to identify swapped solutions. For example, when an image pixel actually contains only fat, the multi-peak model will fit the signals better than the single-peak model, that is, $R_{mp}<R_{sp}$. On the other hand, when the image pixel contains water, but appears to be fat at a "swapped" field map solution, the multi-peak model will provide a worse fit to the signals than the single-peak model, that is, $R_{mp}>R_{sp}$.

It is noted that coefficients other than the relative spectral peak amplitudes can also be utilized for signal separation, including, for example, coefficients indicative of spectral width and other complex spectral behaviors. By way of example, the method of the present invention is also applicable to improve the robustness of water-fat signal separation methods that rely on using such spectral width coefficients. In addition, the present invention can be applicable to the separation of water and fat based on the magnitude of multi-echo signals. An exemplary method of this kind is referred to in the art as "Lipoquant," which is described, for example, by M. Bydder, et al., in "Relaxation Effects in the Quantification of Fat using Gradient Echo Imaging," *Magn. Reson. Imaging*, 2008; 26(3): 347-359. In single-peak Lipoquant, the following relationship is utilized for signal separation:

$$|s(t_n)|^2 = |(\rho_w + \rho_f \cdot e^{i2\pi\Delta ft_n}) \cdot e^{i2\pi\psi t_n} \cdot e^{-t_n/T_2^*}|^2 \qquad \text{Eqn. (7)}$$
$$= (\rho_w^2 + \rho_f^2 + 2 \cdot \cos(2\pi\Delta ft_n) \cdot \rho_w \cdot \rho_f) \cdot e^{-2t_n/T_2^*};$$

where $\rho_w$ is a signal contribution for water signals, and $\rho_f$ is a signal contribution for fat signals. It is noted that the single-peak Lipoquant method cannot discriminate between water and fat signals when swapping occurs, since there is an equal weighting attributed to both water and fat signals. However, this failing can be addressed by incorporating a multi-peak model into Eqn. (7) as follows:

$$|s(t_n)|^2 = |(\rho_w + \rho_f \cdot c_n) \cdot e^{i2\pi\psi t_n} \cdot e^{-t_n/T_2^*}|^2 \qquad \text{Eqn. (8)}$$
$$= (\rho_w^2 + |c_n|^2 \cdot \rho_f^2 + 2 \cdot \text{Re}\{c_n\} \cdot \rho_w \cdot \rho_f) \cdot e^{-2t_n/T_2^*};$$

where $$c_n \sum_{k=1}^{M} \alpha_k \cdot e^{i2\pi\Delta f_k t_n}. \qquad \text{Eqn. (9)}$$

With the multi-peak Lipoquant method, swapping solutions will lead to larger fitting residuals than the correct solutions; therefore, water and fat can be accurately identified using the method of the present invention. It should also be appreciated by those skilled in the art that the method of the present invention is readily adaptable to other water-fat separation methods, such as the two-point Dixon method described by J. Ma, et al., in "Breath-Hold Water and Fat Imaging Using a Dual-Echo Two-Point Dixon Technique with an Efficient and Robust Phase-Correction Algorithm," *Magn. Reson. Med.*, 2004; 52(2):415-419; and a variable projection ("VARPRO") based non-linear fitting method, which is described, for example, by D. Fernando, et al., in "Estimation of Water/Fat Images, $B_0$ Field Map and $T_2^*$ Map Using VARPRO," *Proc. Intl. Soc. Mag. Reson. Med.* 16, 1517 (2008), and in "Joint Estimation of Water/Fat Images and Field Inhomogeneity Map," *Magn. Reson. Med.*, 2008; 59(3): 571-580.

The foregoing considerations are employed to generate a fat likelihood map based on the acquired signal information. Two exemplary methods for generating such a fat likelihood map are discussed below; however, it will be appreciated by those skilled in the art that other methods and variations are possible.

A first exemplary method for producing a fat likelihood map includes finding a field map value such that the corresponding fat content is larger than the water content. Multi-peak and single-peak fat spectrum models are then utilized to determine if this field map value corresponds to a "true" fat pixel, or to a "swapped" fat pixel. This is done by calculating and comparing the residual values from single-peak and multi-peak models at this field map solution using Eqn. (3) above. In this manner, each pixel value in the fat likelihood map, FL, is given by the following:

$$FL = \frac{R_{sp} - R_{mp}}{\max(R_{sp}, R_{mp})}; \qquad \text{Eqn. (10)}$$

where $R_{sp}$ is the residual value calculated using the field map value from the corresponding pixel location in the field map estimate, and using the single-peak fat spectrum model; and $R_{mp}$ is the residual value calculated using the field map value from the corresponding pixel location in the field map estimate, and using the multi-peak fat spectrum model. The range of fat likelihood values is $FL \in [-1,1]$. Negative fat likelihood map values approaching negative one correspond to pixel locations that are increasingly more probable to contain water, whereas positive fat likelihood map values approaching one correspond to pixel locations that are increasingly more probable to contain fat.

A second exemplary method for producing a fat likelihood map includes comparing the residuals of the neighboring two local minima identified when using a multi-peak spectral model for fat. Each pixel value in a fat likelihood map produced in this manner is given by the following:

$$FL = \frac{R_{mp,w} - R_{mp,f}}{\max(R_{mp,w}, R_{mp,f})};\quad \text{Eqn. (11)}$$

where $R_{mp,w}$ is the residual calculated using the field map value corresponding to water at the pixel location, and using the multi-peak model; and $R_{mp,f}$ is the residual calculated using the field map value corresponding to fat at the pixel location, and using the multi-peak model. It is noted that in certain circumstances when $R_{mp,w} \approx R_{sp}$, Eqn. (11) yields substantially the same result as Eqn. (10).

It is important to note that both of the aforementioned exemplary methods for producing the fat likelihood map can be performed on the acquired signals themselves, and can therefore produce fat likelihood maps without an estimate of the field map. In the alternative, the fat likelihood maps can be produced during the process of generating the a field map estimate.

The produced fat likelihood map is used to produce a weighting map that is associated with the current estimates of field map, water, and fat. This weighting map is referred to as a "consistency map," and represents the consistency of the current field map and signal estimates with respect to the fat likelihood maps.

At each pixel location, the relative water and fat contents are checked against the fat likelihood maps. If the relative water and fat contents at the pixel location are consistent, or in agreement, with the fat likelihood map value, then the consistency map value takes the absolute value of the fat likelihood map value. For example, if the relative water and fat contents for a pixel location indicate that the pixel contains substantially only fat, and the fat likelihood map value has a value close to one, then the two measures are consistent. If they are not consistent, the negative of the fat likelihood map value is assigned to consistency map. Therefore, like the fat likelihood maps, consistency maps have values over the range, $CM \in [-1,1]$. Here, a consistency map value, CM, close to positive one suggests strong confidence in the current field map value at the pixel location, according to the spectral differences of water and fat. On the other hand, a consistency map value, CM, close to negative one indicates a high probability that the current field map value is a swapped solution.

To aid the determination of the accuracy of the field map estimate, the smoothness of the field map estimate is characterized on a pixel-by-pixel basis, resulting in a so-called field "smoothness map." For example, a "seed" pixel location is selected from the field map estimate, such as the pixel location associated with the maximum consistency map value, CM, in the related consistency map. The seed pixel is assigned a value of one. The smoothness map is then produced by following the slowest gradient direction in the field map estimate to the next pixel location. For each pixel along the trajectory from the seed pixel to the next pixel, the adjacent pixels are analyzed and their smoothness map value, SM, is calculated in accordance with the following:

$$SM(x,y) = \frac{\sum_n SM(x_n, y_n) \cdot |s(x_n, y_n)| \cdot e^{-f \cdot (\psi(x,y) - \psi(x_n, y_n))^2}}{\sum_n |s(x_n, y_n)|};\quad \text{Eqn. (12)}$$

where $SM(x,y)$ is the smoothness map value at the pixel location, $(x,y)$; $SM(x_n, y_n)$ is the smoothness map value at the $n^{th}$ neighboring pixel location, $(x_n, y_n)$; $s(x_n, y_n)$ is the signal corresponding to the $n^{th}$ neighboring pixel location, $(x_n, y_n)$; f is a "friction factor," which is discussed below; $\psi(x,y)$ is the field map estimate at the pixel location, $(x,y)$; and $\psi(x_n, y_n)$ is the field map estimate at the $n^{th}$ neighboring pixel location.

Thus, the smoothness map value for a given pixel location, $SM(x,y)$, is weighted by the magnitude of the signal from neighboring pixels and is calculated based on the field map differences between the selected pixel location and the neighboring pixel locations. The smoothness map value of the current, selected pixel can therefore be considered as the smoothness map values at neighboring pixels less an amount that penalizes the field map difference between those pixels. It will be appreciated by those skilled in the art that there are many variations of Eqn. (12) that are possible and which can result in similar smoothness maps. The friction factor is a user selected variable that affects how rapidly the smoothness map loses its value.

As will be described below in detail, the consistency and smoothness maps are utilized to determine the accuracy of the field map estimate in relation to the existence of water-fat swapping, and are further employed to update the field map estimate when desired.

Figure 4:
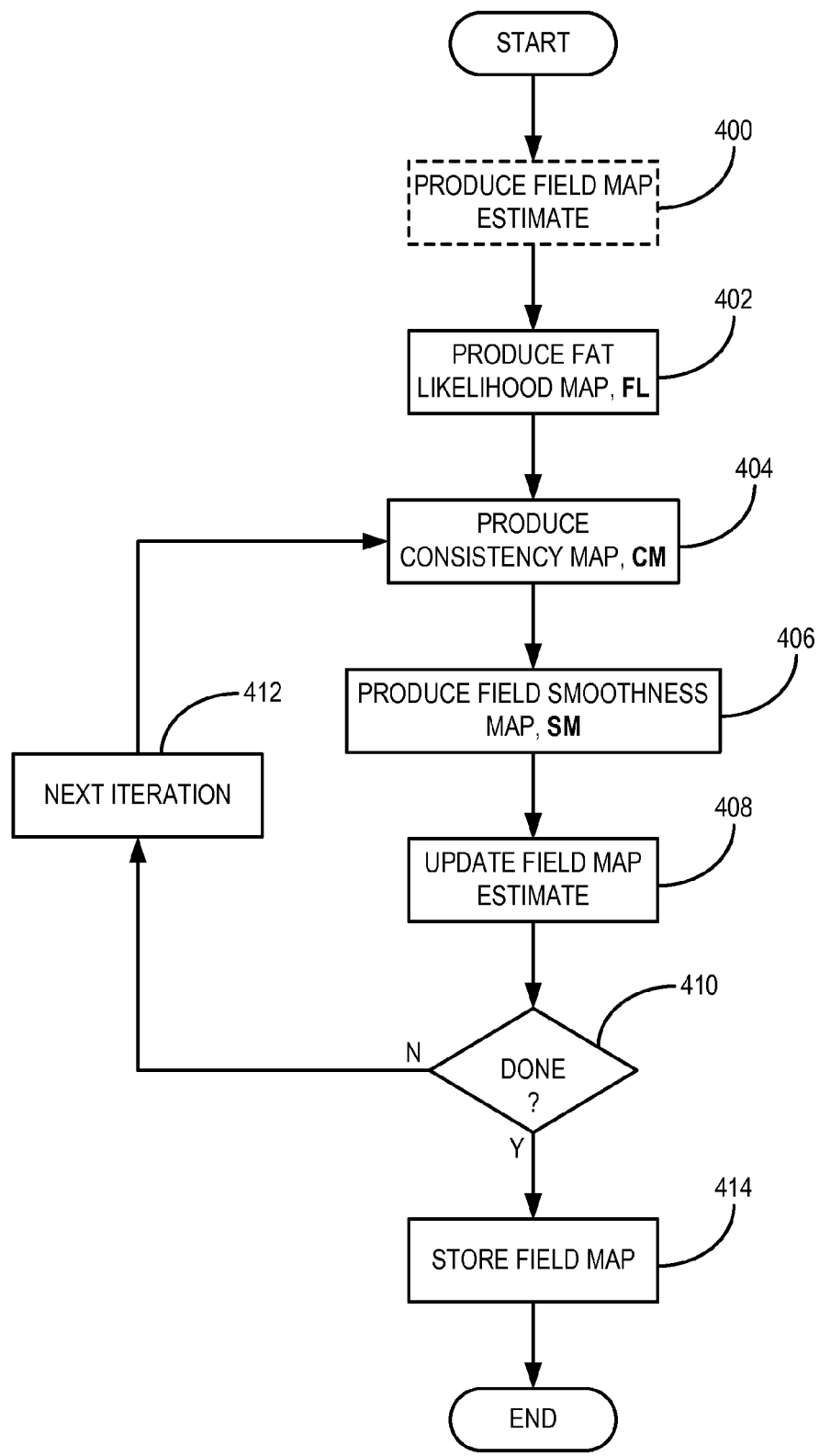
FIG. 4 is a flowchart setting forth the steps of an exemplary method for producing a field map estimate in accordance with the present invention.

Referring now to FIG. 4, a flowchart setting forth an exemplary method for performing water-fat separation in accordance with the present invention is illustrated. The method begins by optionally producing an initial estimate image of inhomogeneities in the MRI system main magnetic field, $B_0$, referred to as a "field map" estimate, as indicated at step 400. In the alternative, however, an initial field map estimate need not be produced; instead, the production of this initial field map estimate may be incorporated into subsequent steps of the method, as will be described below in detail. One exemplary way in which the field map estimate is produced is by performing a pixel-independent IDEAL or $T_2^*$-IDEAL reconstruction with a fixed initial guess at each pixel. In the alternative, the field map estimate can be produced using an algebraic formulation or non-linear estimation methods. In another alternative, the field map values that result in water and fat estimates consistent with the fat likelihood values described below can be used.

A fat likelihood map is produced using the acquired multi-echo signals, as indicated at step 402. As discussed above, the fat likelihood map is produced in relation to calculating a residual value, R, using Eqn. (3) and at least one of the methods described above with respect to Eqns. (10) and (11). Next, a consistency map is produced using the produced fat likelihood map, as indicated at step 404. The consistency map is produced, for example, by comparing the relative water and fat signal contents at each pixel location against the produced fat likelihood map. As discussed above, when the relative water and fat contents at the pixel location are consistent with the fat likelihood map value, the consistency map value is assigned the absolute value of the fat likelihood map value. However, when they are not consistent, the negative of the fat likelihood map value is assigned to consistency map. After the consistency map is produced, a field smoothness map is produced, as indicated at step 406. The smoothness map is produced, for example, in accordance with Eqn. (12) and as described above.

Using the consistency map and the field smoothness map, the field map estimate is updated next, as indicated at step 408. As noted above, the consistency and smoothness maps produced using the spectral differences between water and fat, and the characterization of the field map variation, are both good indicators of water-fat swaps. For both of these maps, large values suggest high confidence in the current field map estimate, whereas low values, that is those values closer to zero or negative one, suggest a high likelihood of a water-fat swap. The consistency and smoothness maps can therefore be used to find those pixel locations with possible water-fat swaps and to recalculate their field map values in accordance with the field map values obtained from nearby highly weighted pixels. The succeeding description provides an exemplary method for updating the field map estimate using the consistency and smoothness maps; however, it will be appreciated by those skilled in the art that there are many possible ways to do this updating.

Figure 5:
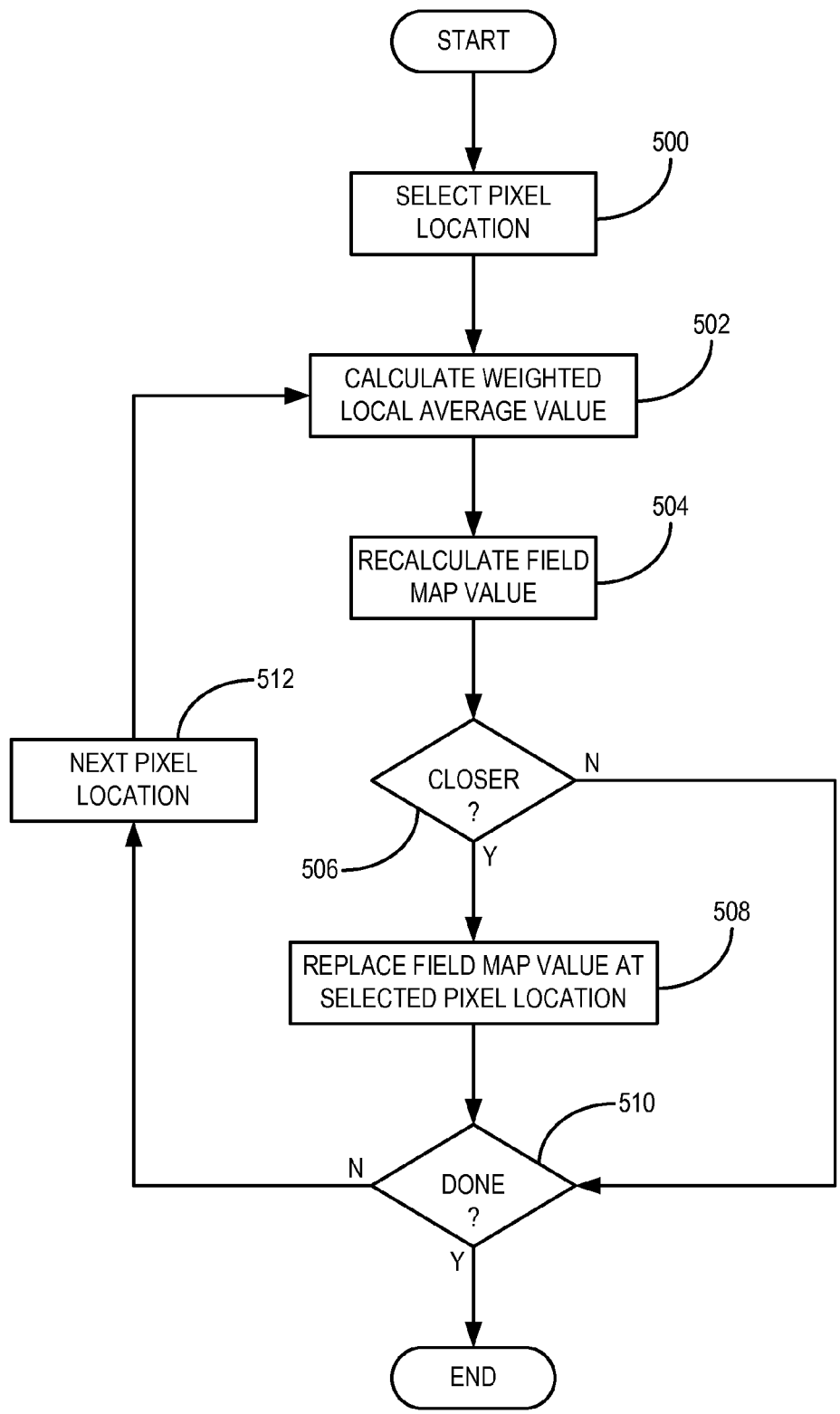
FIG. 5 is a flowchart setting forth the steps of an exemplary method for updating a field map estimate in accordance with the present invention.

Referring particularly now to FIG. 5, a flowchart setting forth the steps of an exemplary method for updating the field map estimate with the produced consistency and smoothness maps is illustrated. The method begins by selecting a pixel location in the field map estimate, as indicated at step 500. For this pixel location, a local weighted average field map value is calculated next, as indicated at step 502. This local average field map value is calculated, for example, by averaging the field map value at the selected pixel location with the field map values at the adjacent pixel locations but weighted by signal strength, consistency map values, and smoothness map values in accordance with the following equation:

$$\psi(x, y) = \frac{\sum_n (\psi(x_n, y_n) \cdot |s(x_n, y_n)| \cdot SM(x_n \cdot y_n) \cdot CM(x_n, y_n))}{\sum_n (|s(x_n, y_n)| \cdot SM(x_n \cdot y_n) \cdot CM(x_n, y_n))}. \quad \text{Eqn. (13)}$$

The weighted field map value is then utilized to find an alternative field map solution. For example, the weighted field map value is used as an initial guess to recalculate the field map value for the selected pixel location using IDEAL, $T_2^*$-IDEAL, or other techniques, as indicated at step 504. As decided at decision block 506, if the alternative field map value is different from the current field map value, and is closer to the local weighted average field map value than the current field map value for the selected pixel location, then the current field map value is replaced with the alternative field map value, as indicated at step 508. If not, the current field map value is kept. A determination is then made at decision block 510 as to whether all of the pixel locations in the field map estimate have been processed. If not, then the next pixel location is selected at step 512 and steps 502-510 repeated as warranted.

Referring again to FIG. 4, after the field map estimate has been updated, a determination is made, as indicated at decision block 410, whether the updated field map estimate satisfies a stopping criterion. An exemplary stopping criteria is when all pixels are determined to be "N" in the step 506. If the updated field map estimate does not satisfy the stopping criterion, the next iteration of the field map correction begins, as indicated at step 412, and steps 404-408 are repeated to produce a new updated consistency map, smoothness map, and field map estimate. When the stopping criterion is satisfied, the updated field map estimate is stored as the field map to be used for water-fat separation, as indicated at step 414. It is noted that the aforementioned method is substantially automated. No manual thresholding is needed. Instead, the method utilizes weighting maps to make the decisions regarding whether water-fat swaps exists and whether recalculation of the field map estimate is desired. The parameters used in the method, though still desired to be selected properly, mostly affect only the speed of convergence.

The consistency map is an important tool during the early iterations of the foregoing method, as it helps in the selection of the correct seed pixel when producing the smoothness map. At later iterations, however, the smoothness map should take over as the primary weighting factor because the consistency map may not be accurate for some pixels due to the inaccuracy of the fat spectrum modeling, or presence of noise or artifacts. With these considerations, the consistency map may be incrementally weighted by a small value, such as 0.02 at each iteration, such that the influence of the consistency map is reduced as the number of iterations increases.

Robust field map estimation in the presence of unconnected, discontinuous tissues (often times referred to as "separate islands") has always been challenging for region growing based algorithms. With the aforementioned method, the consistency map, which is calculated on a pixel-by-pixel basis, is relatively insensitive to separate islands of discontinuous tissue.

On the other hand, the smoothness map may start from one "island" and lose its value before the trajectory reaches the other island due to the "bumpy" noise bands between the islands. As a consequence, the smoothness map may have small values in the other "island," even in the presence of a significantly homogeneous $B_0$ field. The aforementioned method can there for be adapted to "rescue" the smoothness map value when it drops below a certain value. For example, if SM<0.1, the smoothness map can be automatically assigned a value of 0.1. As a result, in the previous example, the smoothness map may have flat values, such as 0.1, in the second "island."

Because the smoothness map essentially weights all pixels in this second island the same, the method relies on the consistency map to determine the likelihood of water-fat swapping in such a situation. It is important to note that it is the relative values of consistency map and smoothness map in the local-averaging that matters. If the consistency map is flat in the local area, the smoothness map is used for weighting effectively. On the other hand, if the smoothness map is flat in the local area, the consistency map is used effectively. Therefore, the proposed method is capable of dealing with separate island situations because the consistency map, which exploits spectral differences between water and fat, and the smoothness map, which exploits field map smoothness, are complementary mechanisms to avoid water-fat swapping.

It is contemplated that there are many ways to adjust the computation of the aforementioned method. By way of example, not all pixels in the field map estimate need to be recalculated during each iteration. Instead, only those pixels that are within a neighborhood of pixels that were updated in the last iteration need to be checked. By way of another example, the smoothness map does not require complete recalculation at each iteration since the trajectory of the smallest field map gradient stays the same until it reaches a pixel whose field map value has been recalculated.

In the preceding description, weighting maps using both the spectral differences (the consistency map) and the field map smoothness (the smoothness map) are produced and utilized for the separation of signal information between two or more distinct species. It is possible, however, to provide a robust algorithm using only one of these weighting maps. By way of example, if only the smoothness map is used, there is no need to assume a multi-peak model; however, a different method for selecting the seed pixel for the smoothness map production is needed. By way of another example, the use of the consistency map alone without any information on field map smoothness will improve the robustness of the species separation, but generally not as much as when combined with the smoothness map.

Figure 6:
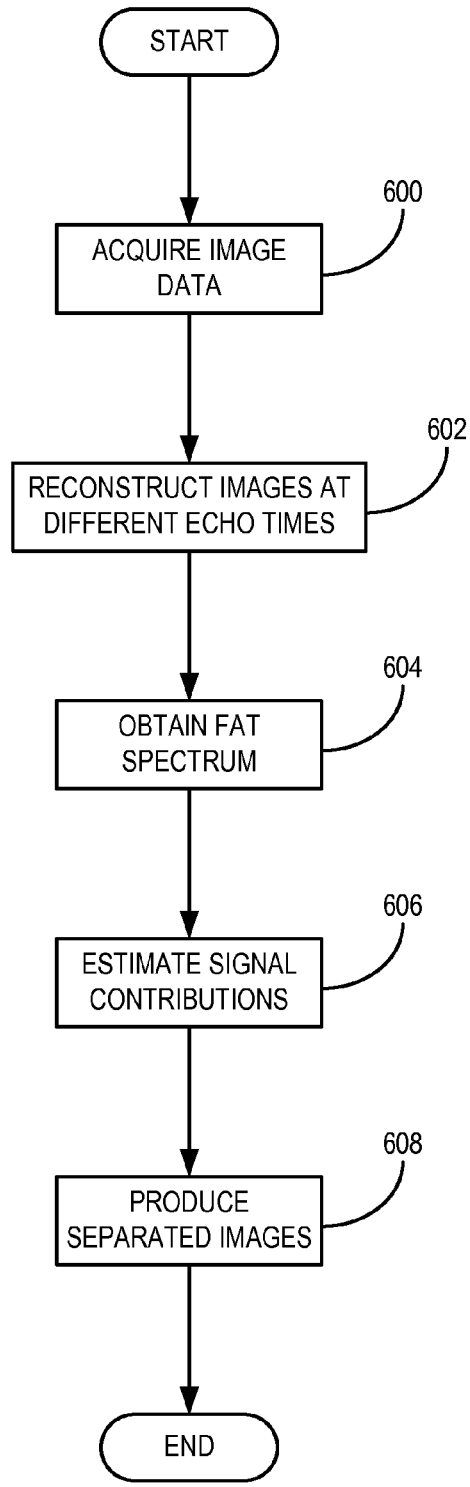
FIG. 6 is a flowchart setting forth the steps of an exemplary method for performing water-fat separation using the field map estimate produced in accordance with the method illustrated in FIG. 4.

Referring now to FIG. 6, a flowchart setting forth the steps of an exemplary method for performing water-fat separation in accordance with the method of the present invention is illustrated. The method begins with the acquisition of image data from the subject, as indicated at step 600. For example, image data is acquired by directing the MRI system with the exemplary SPGR pulse sequence described above and illustrated in FIG. 3. It is noted that image data can be acquired at any number, N, of different echo times, such as two, three, or six different echo times. After the image data has been acquired, images are reconstructed for each of the N different echo times, as indicated at step 602. In this manner, N different images are reconstructed for each imaging slice location. This image reconstruction is performed in the usual manner, for example, by performing a two-dimensional, complex Fourier transformation of the acquired k-space data.

A fat spectrum is obtained next, as indicated at step 604. This spectrum is obtained, for example, using the modeling described by [Middleton et al, ISMRM 2009 (International Society of Magnetic Resonance in Medicine 2009 Annual conference proceedings) abstract 4331)], or by [Yu et al, Magnetic Resonance in Medicine, 2008, 60:1122-1134]. Alternatively, a spectrum self-calibration approach can be performed, such as the one described, for example, in co-pending U.S. patent application Ser. No. 12/104,842, which is herein incorporated by reference in its entirety. The signal contribution from water and fat can then be iteratively estimated, as indicated at process block 606. For example, the signal contributions from water and fat are determined from the following inversion:

$$\rho = (A^H A)^{-1} A^H \cdot D(-\psi) \cdot s \qquad \text{Eqn. (14)};$$

where $(\ldots)^H$ indicates the Hermitian transpose operator; A is a matrix that described the relative weighting of the different spectral peaks and complex phase shifts of the signals at the different echo times, and has the form shown in Eqn. (5) above; $D(\psi)$ is a diagonal matrix that describes the inhomogeneities in the main magnetic field, $B_0$, of the MRI system, and has the form shown in FIG. 4) above; s is a vector representative of the reconstructed images; and $\rho$ is a vector having elements $\rho_w$ and $\rho_f$, which correspond to the estimates of the separate water and fat signal contributions, respectively, and is, therefore, in the form:

$$\rho = \begin{bmatrix} \rho_w \\ \rho_f \end{bmatrix}. \qquad \text{Eqn. (15)}$$

The diagonal matrix, $D(\psi)$, is predicated on an estimate of the field map, $\psi$. Thus, the updated field map estimate produced in accordance with the method described above with respect to FIGS. 4 and 5 is utilized to produce a more robust separation of the water and fat signals. The estimates of the relative signal contributions of water and fat calculated from Eqn. (14) are subsequently used to produce separated water and fat images, as indicated at step 608. Because the field map estimate has been corrected such that swapped solutions are substantially eliminated, the produced water and fat images are significantly reliable depictions of substantially only water and fat, respectively.

The present invention has been described in terms of one or more preferred embodiments, and it should be appreciated that many equivalents, alternatives, variations, and modifications, aside from those expressly stated, are possible and within the scope of the invention. For example, the method of the present invention is also applicable to water-fat separation methods that are based on the magnitude of the acquired signals, such as the Lipoquant method, for example. With such methods, the residual of the fitting can be used to generate a consistency map. Also, smoothing or regularization of noisy regions of the reconstructed images can be used to improve estimates of the residuals, R, in order to improve the noise performance of the consistency and smoothness maps. While the consistency and smoothness maps were described with respect to two dimensions, it is also possible to produce and utilize three-dimensional weighting maps.

The invention claimed is:

1. A method for producing an image of a subject with a magnetic resonance imaging (MRI) system in which signal contributions of at least two species are separated, the steps of the method comprising:
   a) acquiring, with the MRI system, multi-echo signal data from a subject;
   b) fitting the multi-echo signal data to a first signal model in order to produce a first residual value;
   c) fitting the multi-echo signal data to a second signal model in order to produce a second residual value;
   d) performing signal separation of the at least two species in order to produce signal contributions of the at least two species;
   e) selecting from the produced signal contributions a first signal contribution associated with a first one of the at least two species and a second signal contribution associated with a second one of the at least two species by comparing the first and second residual values;
   f) reconstructing at least one of an image of the subject depicting substantially only the first one of the at least two species using the first signal contribution and the acquired multi-echo signal data, and an image of the subject depicting substantially only the second one of the at least two species using the second signal contribution and the acquired multi-echo signal data.

2. The method as recited in claim 1 further including producing a field map estimate during the process of fitting the multi-echo signal data to the first and second signal models in steps b) and c).

3. The method as recited in claim 2 further including calculating a likelihood map using the first and second residual values, and producing, using at least one of the first and second signal contributions and the likelihood map, a consistency map that depicts consistency between the likelihood map and the at least one of first and second signal contributions.

4. The method as recited in claim 3 further including updating the field map estimate using the consistency map.

5. The method as recited in claim 2 further including producing, using the field map estimate and the acquired multi-echo signal data, a smoothness map that depicts a local gradient of the field map, and updating the field map estimate using the smoothness map.

6. The method as recited in claim 2 further including:
   i) calculating a likelihood map using the first and second residual values, the likelihood map depicting a probability of errors in the signal separation performed in step d);
   ii) calculating a weighted field map average value by weighting each pixel location in the field map estimate by information derived from the likelihood map;
   iii) calculating alternative field map values using the weighted field map;
   iv) comparing the alternative field map values and field map estimate values to the weighted field map average values; and
   v) producing an updated field map estimate by replacing values at pixel locations in the field map estimate with alternative field map values when the comparison performed in step iv) indicates alternative field map values are closer to the weighted average field map values than the field map estimate values.

7. The method as recited in claim 1 in which step e) includes calculating a likelihood map using the first and second residual values, the likelihood map depicting a probability of pixel locations containing a particular one of the at least two species.

8. The method as recited in claim 1 in which the at least two species include at least two of water, fat, silicone, hyperpolarized carbon-13, metabolites containing hyperpolarized carbon-13, hyperpolarized xenon-129, hyperpolarized helium-3, acetone, choline, and lactate.

9. The method as recited in claim 1 in which step a) includes applying a magnetization preparation radio frequency (RF) pulse prior to acquiring the multi-echo signal data in order to alter at least one of longitudinal magnetization and transverse magnetization of one of the at least two species so that at least one spectral peak associated with the one of the at least two species is made more distinct.

10. The method as recited in claim 9 in which the magnetization preparation RF pulse includes at least one of an inversion recovery pulse, a $T_2$-preparation pulse, a fat-saturation pulse, and a magnetization transfer pulse.

11. A method for producing an image of a subject with a magnetic resonance imaging (MRI) system in which signal contributions of at least two species are separated, the steps of the method comprising:
   a) acquiring, with the MRI system, multi-echo signal data from a subject;
   b) fitting the multi-echo signal data to a signal model in order to produce a plurality of signal separation solutions and a respective plurality of fitting residuals, the signal model including distinct terms for the at least two species;
   c) comparing the plurality of fitting residuals in order to identify a fitting residual corresponding to a correct signal separation solution; and
   d) reconstructing, from the acquired multi-echo signal data and using the correct signal separation solution, at least one of an image of the subject depicting substantially only one of the at least two species and an image of the subject depicting substantially only another one of the at least two species.

12. The method as recited in claim 11 further including producing a field map estimate during the process of fitting the multi-echo signal data to the signal model in step b).

13. The method as recited in claim 11 in which the signal model includes information regarding a plurality of spectral peaks in a spectrum of at least one of the at least two species.

14. The method as recited in claim 13 in which the one of the at least two species is water, the another one of the at least two species is fat, and the signal model includes information regarding a plurality of spectral speaks in a spectrum of fat and a single spectral peak in a spectrum of water.

15. The method as recited in claim 11 in which step c) includes:
   identifying ones of the plurality of fitting residuals associated with the one of the at least two species and other ones of the plurality of fitting residuals associated with the another one of the at least two species; and
   producing a likelihood map using the identified ones and other ones of the fitting residuals.

16. The method as recited in claim 11 in which step a) includes applying a magnetization preparation radio frequency (RF) pulse prior to acquiring the multi-echo signal data in order to alter at least one of longitudinal magnetization and transverse magnetization of one of the at least two species so that at least one spectral peak associated with the one of the at least two species is made more distinct.

17. The method as recited in claim 16 in which the magnetization preparation RF pulse includes at least one of an inversion recovery pulse, a $T_2$-preparation pulse, a fat-saturation pulse, and a magnetization transfer pulse.

18. A method for producing an image of a subject with a magnetic resonance imaging (MRI) system in which signal contributions of at least two species are separated, the steps of the method comprising:
   a) acquiring, with the MRI system, multi-echo signal data from a subject;
   b) performing a signal separation using the acquired multi-echo signal data in order to produce signal contributions for each of the at least two species;
   c) producing, using the acquired multi-echo signal data, a spectral difference weighting map that depicts a probability of a correct signal separation solution at each pixel location therein, and that is indicative of spectral differences between a selected pair of the at least two species;
   d) producing, using the acquired multi-echo signal data, a smoothness weighting map that depicts a probability of an off-resonance error at pixel locations therein, and that is indicative of a local gradient of a field map estimate;
   e) updating the signal contributions using the spectral difference weighting map and the smoothness weighting map; and
   f) reconstructing at least one of an image depicting substantially only the one of the at least two species using the acquired multi-echo signal data and an associated one of the updated signal contributions, and an image depicting substantially only another one of the at least two species using the acquired multi-echo signal data and an associated another one of the updated signal contributions.

19. The method as recited in claim 18 in which step c) includes:
   fitting the acquired multi-echo signal data to a signal model in order to produce residual values that are indicative of a goodness of a fit between the acquired multi-echo signal data and the signal model; and
   producing a likelihood map using one of the residual values and other ones of the residual values.

20. The method as recited in claim 19 in which step c) includes producing the spectral difference weighting map using the signal contributions and the likelihood map.

21. The method as recited in claim 18 in which step c) includes fitting the acquired multi-echo signal data to a first signal model and a second signal model in order to produce a first residual value and a second residual value, the first and second residual values being indicative of a goodness of a fit between the acquired multi-echo signal data and the first and second signal models, respectively; and produce a likelihood map using the first residual value and the second residual value.

22. The method as recited in claim 21 in which step c) includes producing the spectral difference weighting map using the signal contributions and the likelihood map.

23. The method as recited in claim 18 in which step c) further includes:

producing a field map estimate;
selecting a seed pixel location in the field map estimate;
assigning a smoothness map value to the seed pixel location; and
calculating a smoothness map value for a local pixel location using the acquired signal data and the field map estimate value corresponding to the local pixel location and field map estimate values from pixel locations neighboring the local pixel location.

24. The method as recited in claim 18 in which the at least two species include at least two of water, fat, silicone, hyperpolarized carbon-13, metabolites containing hyperpolarized carbon-13, hyperpolarized xenon-129, hyperpolarized helium-3, acetone, choline, and lactate.

25. The method as recited in claim 18 in which step a) includes applying a magnetization preparation radio frequency (RF) pulse prior to acquiring the multi-echo signal data in order to alter at least one of longitudinal magnetization and transverse magnetization of one of the at least two species so that at least one spectral peak associated with the one of the at least two species is made more distinct.

26. The method as recited in claim 25 in which the magnetization preparation RF pulse includes at least one of an inversion recovery pulse, a $T_2$-preparation pulse, a fat-saturation pulse, and a magnetization transfer pulse.

* * * * *